United States Patent
Yokoyama et al.

(10) Patent No.: US 6,768,147 B2
(45) Date of Patent: Jul. 27, 2004

(54) SEMICONDUCTOR DEVICE AND METHOD OF FABRICATING THE SAME

(75) Inventors: Mitsunori Yokoyama, Yamanashi (JP); Masaki Nagahara, Yamanashi (JP)

(73) Assignee: Fujitsu Quantum Devices Limited, Yamanashi (JP)

(*) Notice: Subject to any disclaimer, the term of this patent is extended or adjusted under 35 U.S.C. 154(b) by 0 days.

(21) Appl. No.: 10/360,733

(22) Filed: Feb. 10, 2003

(65) Prior Publication Data

US 2003/0183844 A1 Oct. 2, 2003

(30) Foreign Application Priority Data

Mar. 28, 2002 (JP) ........................................ 2002-093379

(51) Int. Cl.[7] .............................................. H01L 21/80
(52) U.S. Cl. ...................................................... 257/285
(58) Field of Search ................................ 257/194–196, 257/256, 269, 285, 287, E29.246, E29.248, E29.252, E21.403, 192, 504, E21.407, E27.148, E29.314, E21.421, E29.265; 438/167, 172, FOR 179, FOR 181, 168, 174, 175, 181, FOR 198

(56) References Cited

U.S. PATENT DOCUMENTS

| | | | | | |
|---|---|---|---|---|---|
| 4,641,161 A | * | 2/1987 | Kim et al. | .................. | 257/192 |
| 4,662,058 A | * | 5/1987 | Cirillo et al. | ................ | 438/168 |
| 4,772,925 A | * | 9/1988 | Fukuzawa et al. | .......... | 257/194 |
| 5,023,676 A | * | 6/1991 | Tatsuta | ....................... | 257/280 |
| 5,087,950 A | * | 2/1992 | Katano | ....................... | 257/472 |
| 5,091,759 A | * | 2/1992 | Shih et al. | .................. | 257/192 |
| 5,124,770 A | * | 6/1992 | Umemoto et al. | .......... | 257/192 |
| 5,151,757 A | * | 9/1992 | Enoki et al. | ................. | 257/194 |
| 5,187,111 A | * | 2/1993 | Nogami et al. | ............. | 438/181 |
| 5,196,358 A | * | 3/1993 | Boos | .......................... | 438/186 |
| 5,196,359 A | * | 3/1993 | Shih et al. | .................. | 438/172 |
| 5,242,846 A | * | 9/1993 | Izumi et al. | ................. | 438/186 |
| 5,488,237 A | * | 1/1996 | Kuwata | ...................... | 257/194 |
| 5,532,507 A | * | 7/1996 | Wada | ......................... | 257/280 |
| 5,578,844 A | * | 11/1996 | Marukawa et al. | ......... | 257/280 |
| 6,198,116 B1 | * | 3/2001 | Cerny et al. | ................. | 257/194 |
| 2002/0000570 A1 | * | 1/2002 | Nakajima et al. | ........... | 257/192 |
| 2002/0005528 A1 | * | 1/2002 | Nagahara | ..................... | 257/189 |
| 2003/0168672 A1 | * | 9/2003 | Takazawa et al. | ........... | 257/190 |

FOREIGN PATENT DOCUMENTS

| | | | | | |
|---|---|---|---|---|---|
| JP | 03105929 A | * | 5/1991 | ......... | H01L/21/338 |
| JP | 04225534 A | * | 8/1992 | ......... | H01L/21/338 |
| JP | 11150124 A | * | 6/1999 | ......... | H01L/21/338 |

* cited by examiner

*Primary Examiner*—George Fourson
*Assistant Examiner*—Brook Kebede
(74) *Attorney, Agent, or Firm*—Armstrong, Kratz, Quintos, Hanson & Brooks, LLP

(57) ABSTRACT

A compound semiconductor device includes a gate electrode, a drain electrode, and a source electrode, and a p-type semiconductor layer provided between the gate electrode and the drain electrode. The p-type semiconductor layer has a lower acceptor concentration on a drain side thereof than that on a gate side thereof.

13 Claims, 7 Drawing Sheets

SEMICONDUCTOR DEVICE AND METHOD OF FABRICATING THE SAME

BACKGROUND OF THE INVENTION

1. Field of the Invention

The present invention generally relates to a semiconductor device using compound semiconductors and a method of fabricating such a compound semiconductor device. More particularly, the present invention relates to improvements in the off-state breakdown characteristics.

2. Description of the Related Art

There are known, as compound semiconductor devices, a MESFET (Metal Semiconductor Field Effect Transistor) and a HEMT (High Electron Mobility Transistor). Among the field effect transistors (FETs) mentioned above, the high-power type of FETs is required to have a sufficient off-state breakdown voltage.

SUMMARY OF THE INVENTION

An object of the present invention is to provide a semiconductor device having a novel layer arrangement that enables improvements in the off-state breakdown characteristics and a method of fabricating such a device.

The above object of the present invention is achieved by a compound semiconductor device including: a gate electrode, a drain electrode, and a source electrode; and a p-type semiconductor layer provided between the gate electrode and the drain electrode, the p-type semiconductor layer having a lower acceptor concentration on a drain side thereof than that on a gate side thereof.

The above object of the invention is also achieved by a method of fabricating a compound semiconductor device comprising the steps of: (a) growing an epitaxial substrate; and (b) forming a p-type semiconductor layer provided between a gate electrode and a the drain electrode formed on the epitaxial substrate, the p-type semiconductor layer having a lower acceptor concentration on a drain side thereof than that on a gate side thereof.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given, with reference to FIGS. 1 through 3, of semiconductor devices related to the present invention in order to facilitate better understanding of the present invention.

Figure 1:
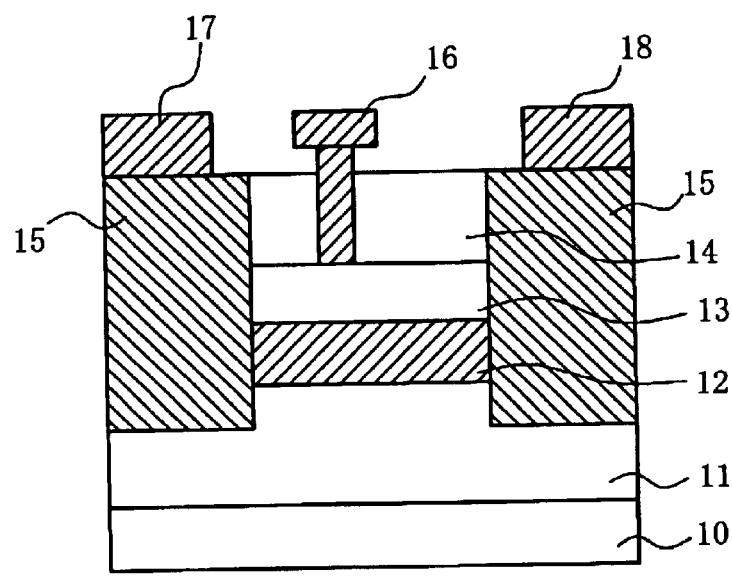
FIG. 1 is a cross-sectional view of a MESFET related to the present invention.
Figure 2:
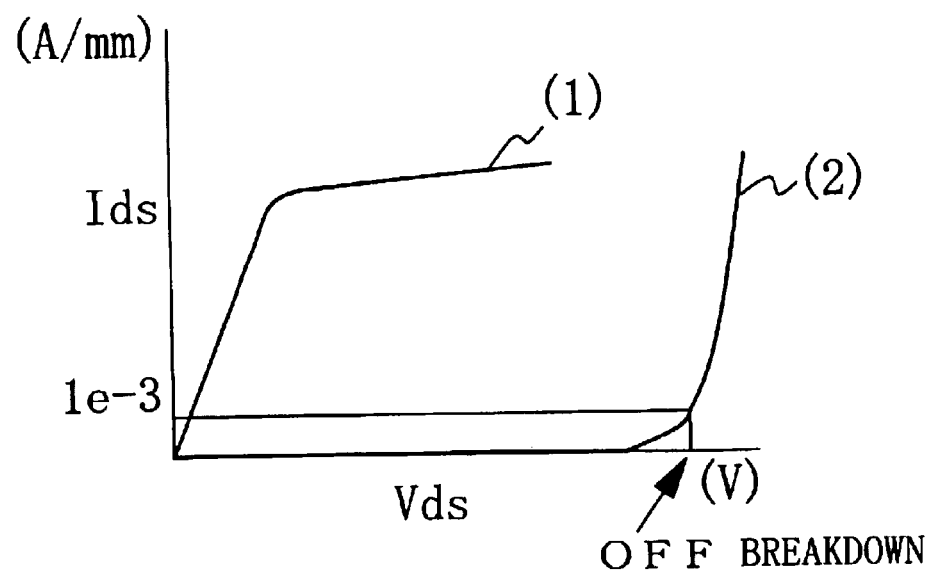
FIG. 2 is a graph of the off-state breakdown characteristic of the MESFET shown in FIG. 1.

FIG. 1 is a cross-sectional view of a MESFET, and FIG. 2 is a graph of the I–V (drain current vs. drain voltage) characteristic of the MESFET shown in FIG. 1. Referring to FIG. 1, the MESFET has a semi-insulating GaAs substrate 10, an undoped AlGaAs layer 11, an n-type GaAs layer 12, an undoped AlGaAs layer 13, an undoped GaAs layer 14, ohmic contact layers 15, a gate electrode 16, a source electrode 17 and a drain electrode 18. The layer 11 serves as a buffer layer 11, and the layer 12 serves as a channel layer. The layer 13 serves as a barrier layer, and the layer 14 serves as a spacer layer.

When the drain voltage Vds with respect to the source (hereinafter simply referred to as drain voltage) changes the depletion region to completely cover the thickness of the channel with a gate voltage being applied, a current (drain current) Ids flowing from the drain to source becomes almost constant (curve (1) shown in FIG. 2). The position in which the constant current is available depends on the gate voltage. The off-state breakdown voltage is defined as the drain voltage Vds for which a drain current ids of 1E-3 A/mm flows at the time of pinchoff (when the depletion region extends into the entire thickness of the channel).

When the FET is off, a large voltage is applied between the drain electrode 18 and the gate electrode 16. Thus, a large number of electric lines of force (large electric field) concentrates toward the gate electrode 16 from the n-type GaAs layer 12 and the undoped AlGaAs layer 13 just below the gate closer to the side of the drain. Thus, the off-state breakdown voltage depends on the concentration of electric liens of force toward the gate. It can be seen from the above consideration that the off-state breakdown voltage can be improved by relaxing the concentration of electric lines of force toward the gate electrode 16.

A dual-gate structure acts as means for relaxing the concentration of electric lines of force toward the gate. The dual-gate structure has a second gate electrode interposed between the original gate electrode and the drain electrode. The second gate has a work function different from that of the original gate electrode. A negative space-charge (acceptor) region formed at the side of the drain electrode also acts to relax the concentration.

Figure 3:
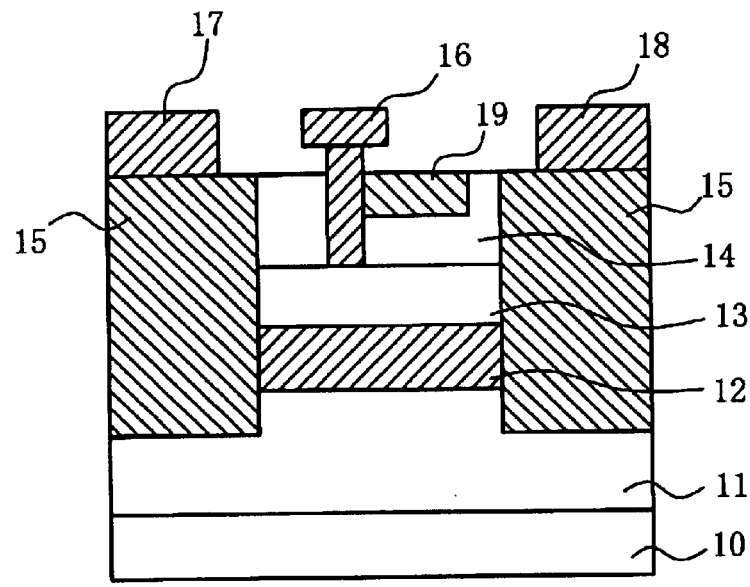
FIG. 3 is a cross-sectional view of another MESFET related to the present invention.

FIG. 3 is a cross-sectional view of a MESFET having a space-charge region acting as means for relaxing the concentration of electric lines of force toward the gate. In FIG. 3, parts that are the same as those shown in FIG. 1 are given the same reference numerals. A p-type semiconductor region 19 is embedded in the spacer layer 14 between the gate electrode 16 and the drain electrode 18. The p-type semiconductor region 19 is an acceptor region in which an even acceptor concentration or density (Na) is available along the channel length. The p-type semiconductor region 19 causes the electric lines of force from the drain electrode 18 toward the gate electrode 16 to spread over. An electric field develops between the space charge in the barrier layer 13 and the acceptor in the p-type semiconductor region 19, so that the electric lines of force toward the gate electrode 16 can be weakened.

The inventors found out the following. In practice, the acceptor region 19 does not improve the off-state breakdown voltage significantly, and may degrade it in some cases. If the acceptor concentration is relatively low, the electric field just below the gate will not be relaxed well. In contrast, if the acceptor concentration is relatively high, the electric field just below the gate will be relaxed well, but the ratio of potential change on the drain-side of the acceptor region 19 will be high. In the off state, a positive voltage is applied to the drain electrode 18, so that a large electric field is exerted on the drain side of the p-type semiconductor region 19. This results in impact ions, so that induced hole/electron pairs make a leakage current.

Taking into consideration the above, one aspect of the present invention is to improve the off-state breakdown voltage.

According to one aspect of the present invention, a p-type semiconductor region or layer provided between the gate and drain of a compound semiconductor device has an acceptor concentration on the drain side thereof lower than that on the gate side. The gate-side portion of the p-type semiconductor region has a comparatively high acceptor concentration, and acts to relax concentration of the electric field on the gate. The drain-side portion of the p-type semiconductor region has a comparatively low acceptor concentration, and acts to relax the electric field between the p-type semiconductor region and the drain and to suppress induced impact ionization and reduce the leakage current. Thus, the off-state breakdown characteristic can be improved.

(First Embodiment)

Figure 4:
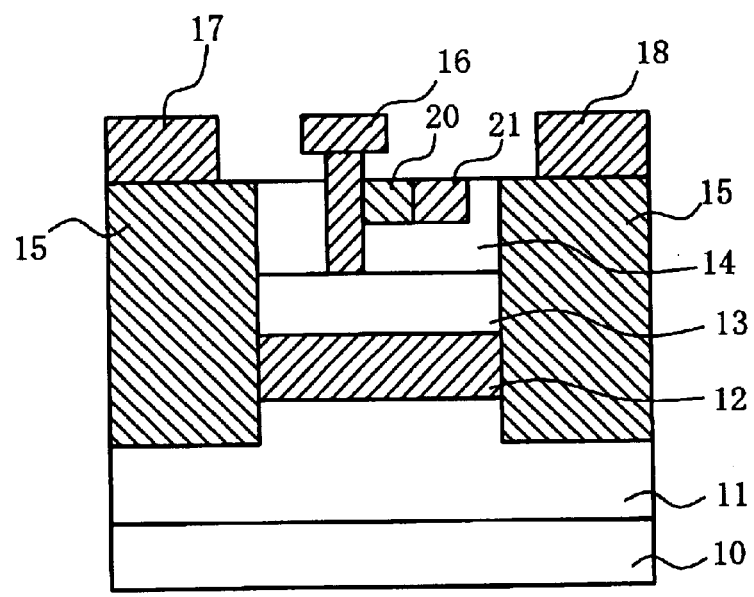
FIG. 4 is a cross-sectional view of a MESFET according to a first embodiment of the present invention.

A description will now be given, with reference to FIG. 4, of a MESFET according to a first embodiment of the present invention. In FIG. 4, parts that are the same as those shown in the previously described figures are given the same reference numerals.

Referring to FIG. 4, a first p-type semiconductor region or layer 20 and a second p-type semiconductor region or layer 21 are embedded in the spacer layer 14 between the gate electrode 16 and the drain electrode 18. That is, the first p-type semiconductor region 20 and the second p-type semiconductor region 21 are embedded in the undoped GaAs layer 14 that does not contain impurities substantially. The first p-type semiconductor region 20 mainly acts to relax concentration of the electric field on the gate electrode 16, more specifically, a portion of the gate electrode 16 that contacts the barrier layer 13. The second p-type semiconductor region 21 mainly acts to weaken the intensity of the electric field between a drain-side portion of the first p-type semiconductor region 20 and the drain electrode 18.

The first p-type semiconductor region 20 is an acceptor region (a negative space-charge region) formed by ion implantation. Similarly, the second p-type semiconductor region 21 is an acceptor region (a negative space-charge region) formed by ion implantation. The acceptor concentration of the first p-type semiconductor region 20 is higher than that of the second p-type semiconductor region 21. In other words, the acceptor concentration of the second p-type semiconductor region 21 is lower than that of the first p-type semiconductor region 20. That is, the first p-type semiconductor region 20 is a p$^+$-type layer, and the second p-type semiconductor region 21 is a p$^-$-type layer. The first p-type semiconductor region 20 is closer to the gate electrode 16 than the second p-type semiconductor region 21. The second p-type semiconductor region 21 is closer than the drain electrode 18 than the first p-type semiconductor region 20. The first p-type semiconductor region 20 in FIG. 4 contacts the gate electrode 16. The first p-type semiconductor region 20 may be separated from the gate electrode 16 via the spacer layer 14. The first p-type semiconductor region 20 and the second p-type semiconductor region 21 are adjacent to each other. The first p-type semiconductor region 20 and the second p-type semiconductor region 21 have an identical depth in FIG. 4, but may have different depths. For instance, the second p-type semiconductor region 21 is thicker (deeper) than the first p-type semiconductor region 20. The p-type semiconductor region 21 shown in FIG. 4 is separated from the drain-side ohmic contact layer 15, but may be in contact therewith.

As has been described previously, the first p-type semiconductor region 20 mainly acts to relax the concentration of the electric field on the gate electrode 16, while the second p-type semiconductor region 21 mainly acts to weaken the electric field developed between the drain-side portion of the first p-type semiconductor region 20 and the drain electrode 18. The electric field develops between the space charge in the barrier layer 13 and the first p-type semiconductor region 20, so that the concentration of the electric field toward the gate electrode 16 can be relaxed. The second p-type semiconductor region 21 having comparatively low acceptor concentration is provided between the first p-type semiconductor region 20 and the drain electrode 18, so that the electric field applied to the drain-side edge of the first p-type semiconductor region 20 can be relaxed. That is, some electric lines of force from the drain electrode 18 toward the first p-type semiconductor region 20 are absorbed by the second p-type semiconductor region 21. This suppresses induced impact ionization, so that the leakage current can be reduced greatly. It is therefore possible to improve the off-state breakdown voltage while the leakage current can be reduced greatly.

The two p-type semiconductor regions 20 and 21 may be handled as a single p-type semiconductor region provided between the gate electrode 16 and the drain electrode 18. The acceptor concentration of the single p-type semiconductor region has a decreasing profile from the gate-electrode side along the channel length. That is, the acceptor concentration of the p-type semiconductor region decreases in the channel direction in which the electrons move to the drain. The layer structure shown in FIG. 4 has a single stepwise change of the acceptor concentration. Alternatively, the layer structure may have two or more stepwise changes of the acceptor concentration. In this case, three or more p-type semiconductor regions or layers are provided in the spacer layer 14 between the gate electrode 16 and the drain electrode 18 and have respective acceptor concentrations that decrease in order toward the drain electrode 18. It is also possible to employ a gentle or gradual change of acceptor concentration.

A description will now be given of a more specific structure of the MESFET according to the first embodiment of the invention and a method of fabricating the same as a first example.

Figure 5A:
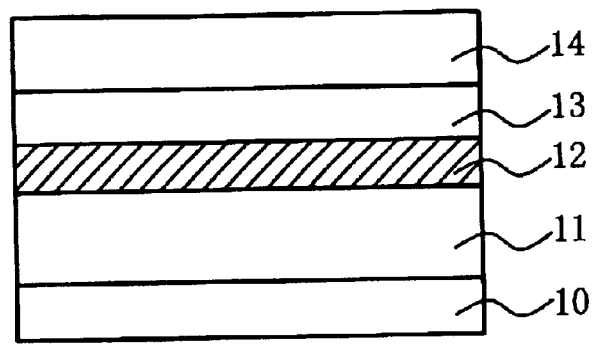
FIGS. 5A through 5D are cross-sectional views illustrating a process of fabricating the MESFET shown in FIG. 4.
Figure 5B:
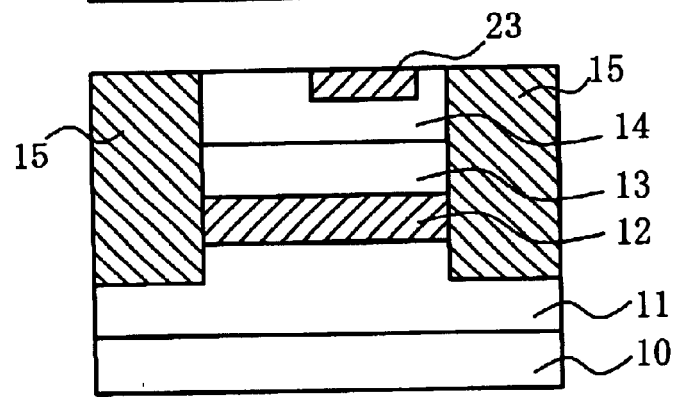
Figure 5C:
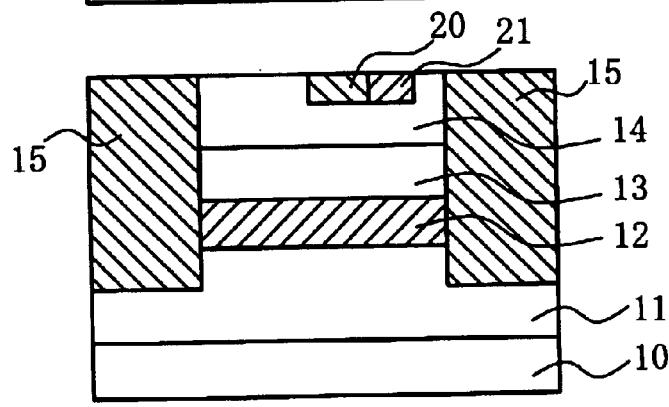

FIGS. 5A through 5B are cross-sectional views illustrating a method of fabricating the first example of the MESFET. As shown in FIG. 5A, an epitaxial substrate (wafer) is formed which includes, on the semi-insulating GaAs substrate 10, the undoped AlGaAs layer 11, the n-GaAs layer 12, the undoped AlGaAs layer 13 and the undoped GaAs layer 14, which layers are epitaxially grown in this order. Next, Si28+ is implanted into the source and drain regions in the epitaxial substrate. Then, as is shown in FIG. 5B, a p-type impurity of Mg+ is implanted in a region 23 at a dose of 1E13 cm$^{-2}$ and 25 keV. Subsequently, Mg+ is additionally implanted in a portion of the region 23 that should be the first p-type semiconductor region 20 at a dose of 7E13 cm$^{-2}$ and 25 keV. Thereafter, the region 23 is annealed for activation, so that the first p-type semiconductor region 20 and the second p-type semiconductor region 21 are derived from the region 23, as shown in FIG. 5C. Then, He+ is implanted for element isolation (this is omitted from illustration of FIG. 5C). This implantation uses photoresist as mask.

Figure 5D:
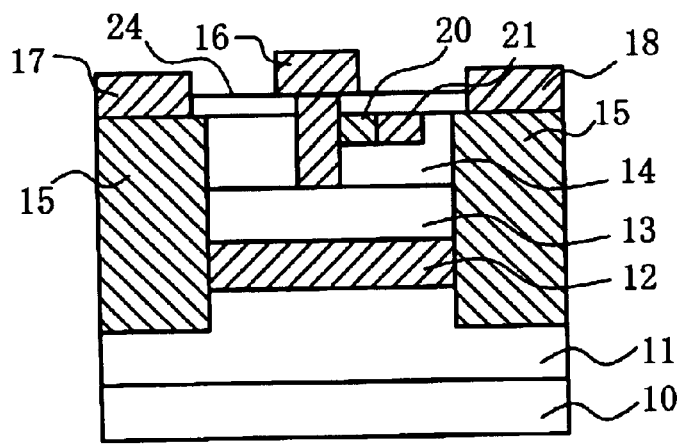

Then, as is shown in FIG. 5D, an insulating film 24 of, for example, silicon oxide (SiO$_2$) is deposited on the epitaxial substrate. Thereafter, a hole or opening for forming the gate electrode 16 is formed in the insulating film 24 by patterning and dry etching. Then, tungsten silicide (WSi) is provided by sputtering, and Ti/Au is deposited. Further, plating of Au is provided and ion milling is performed so that a portion that is to be the gate electrode 16 is left. Then, a layer of AuGe/Ni/Au is deposited in positions of the source electrode 17 and the drain electrode 18, and is then alloyed. This results in the source electrode 17 and the drain electrode 18 on the ohmic contact layers 15.

Figure 6:
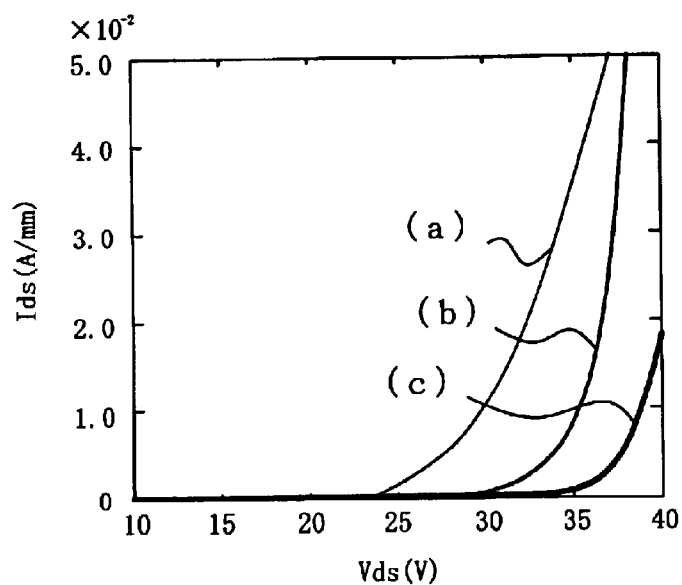
FIG. 6 is a graph of the off-state breakdown characteristic of the MESFET shown in FIG. 4.

FIG. 6 is a graph of the off-state breakdown characteristic of the-first example mentioned above. The horizontal axis of the graph denotes the drain voltage Vds (V), and the vertical axis thereof denotes the drain current Ids (A/mm). A curve (c) is the off-state breakdown characteristic of the first example fabricated by the above-mentioned process. A curve (a) is the off-state breakdown characteristic of the transistor shown in FIG. 3. The off-state breakdown voltage of the first example is 34.5 V, whereas the off-state breakdown voltage of the transistor is 24.5 V. Thus, an improvement in the off-state breakdown voltage as much as 10.0 V is obtained according to the present invention.

The first p-type semiconductor region 20 and the second p-type semiconductor region 21 are formed by ion implantation. Thus, the profile of the acceptor impurity in each of the regions 20 and 21 has a Gaussian distribution. The first p-type semiconductor region 20 and the second p-type semiconductor region 21 may be formed by a process of selective growth instead of ion implantation. In FIG. 5A, the spacer layer 14 is etched so as to form a concave region for the regions 20 and 21. Then, the process of selective growth is performed twice so as to form the first p-type semiconductor layer 20 having an acceptor impurity concentration of 5E18 cm$^{-3}$ and a thickness of 20 nm and the second p-type semiconductor layer 21 having an acceptor impurity concentration of 1E18 cm$^{-3}$ and a thickness of 20 nm. The off-state breakdown characteristic of the MESFET thus fabricated is indicated by a curve (b). The off-state breakdown voltage of this MESFET is 31.5 V.

It is also possible to form the first p-type semiconductor region 20 by the process of selective growth and form the second p-type semiconductor region 21 by ion implantation. That is, the combination of selective growth and ion implantation can be used to form the regions 20 and 21. It is also possible to form the regions 20 and 21 by the process of impurity diffusion.

(Second Embodiment)

Figure 7:
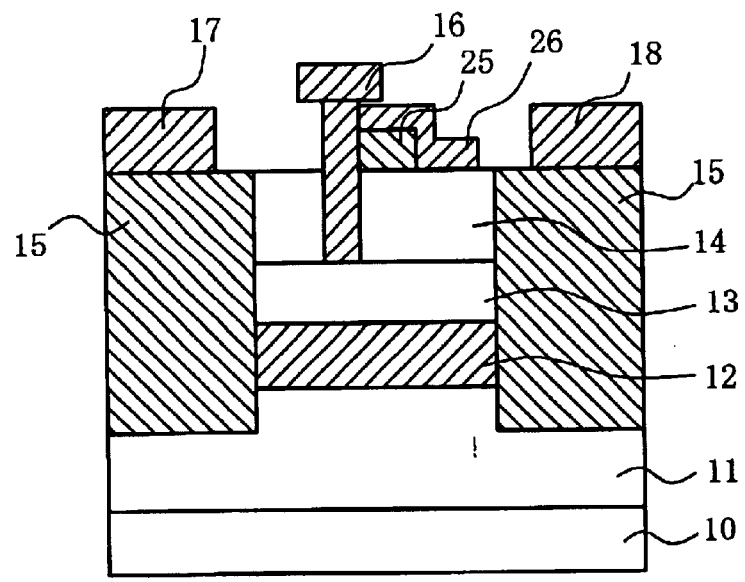
FIG. 7 is a cross-sectional view of a MESFET according to a second embodiment of the present invention.

FIG. 7 is a cross-sectional view of a MESFET according to a second embodiment of the present invention. In FIG. 7, parts that are the same as those of the first embodiment of the invention are given the same reference numerals. The second embodiment of the invention is a variation of the first embodiment thereof.

Referring to FIG. 7, a first p-type semiconductor layer 25 and a second p-type semiconductor layer 26 are formed on the undoped GaAs spacer layer 14 by the process of selective growth. The first p-type semiconductor layer 25 corresponds to the first p-type semiconductor region 20 of the first embodiment of the invention, and the second p-type semiconductor layer 26 corresponds to the second p-type semiconductor region 21 thereof. The second p-type semiconductor layer 26 has an acceptor concentration lower than that of the first p-type semiconductor layer 25. The second p-type semiconductor layer 26 has an overlap portion on the first p-type semiconductor layer 25. This overlap structure results from the process of selective growth, and is not an essential portion involved in relaxation of concentration of the electric field on the gate electrode 16. The first and second layers 25 and 26 may be grown after the gate electrode 16 is formed or vice versa. When the gate electrode 16 is formed in advance of the layers 25 and 26, the gate electrode 16 may be made of a refractory metal such as WSi. In contrast, when the first and second layers 25 and 26 are formed in advance, the gate electrode 16 may be made of a metal other than refractory metal, such as aluminum (Al) or titanium (Ti).

The off-state breakdown voltage of the second embodiment was measured in which the first p-type semiconductor layer 25 has an acceptor concentration of 1E18 cm$^{-3}$ and a thickness of 20 nm, and the second p-type semiconductor layer 26 has an acceptor concentration of 5E17 cm$^{-3}$ and a thickness of 10 nm. The off-state breakdown voltage thus obtained was approximately 30 V. This off-state breakdown voltage is slightly lower than that of the first embodiment of the invention (equal to 31.5 V). This is because the first and second p-type semiconductor regions 20 and 21 are closer to the bottom portion of the gate electrode 16 than the first and second p-type semiconductor layers 25 and 26.

(Third Embodiment)

Figure 8:
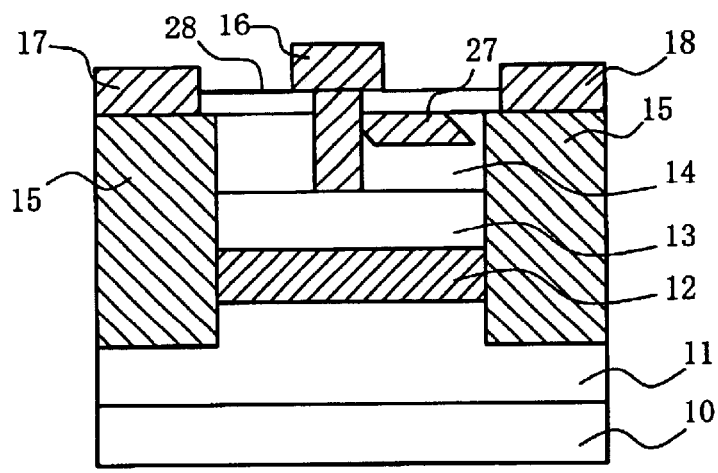
FIG. 8 is a cross-sectional view of a MESFET according to a third embodiment of the present invention.

FIG. 8 is a cross-sectional view of a MESFET according to a third embodiment of the present invention, in which parts that are the same as those shown in the previously described figures are given the same reference numerals.

A single p-type semiconductor region or layer 27 is formed in the spacer layer 14 between the gate electrode 16 and the drain electrode 18. The p-type semiconductor region 27 can be formed by carrying out ion implantation once. The p-type semiconductor region 27 has a decreasing acceptor profile along the channel from the gate electrode 16 to the drain electrode 18. As will be described layer, the p-type semiconductor region 27 can be formed by oblique ion implantation in which ions are obliquely implanted from the gate electrode 16 toward the drain electrode 18. The region 27 thus formed has a slant Gaussian distribution of the acceptor concentration. That is, the p-type semiconductor region 27 has a slant Gaussian distribution profile of acceptor concentration. A portion of the p-type semiconductor region 27 close to the gate electrode 16 has a comparatively high acceptor concentration. The electric lines of force act between the gate-side portion of the p-type semiconductor region 27 and the space charge in the barrier layer 13, so that concentration of the electric field just below the gate electrode 16 can be relaxed. A portion of the p-type semiconductor region 27 close to the drain electrode 18 has a comparatively low acceptor concentration, so that induced impact ionization can be suppressed. Thus, the leakage current can be reduced greatly. Consequently, the MESFET according to the third embodiment of the invention has an improved off-state breakdown voltage while reducing the leakage current.

Figure 9A:
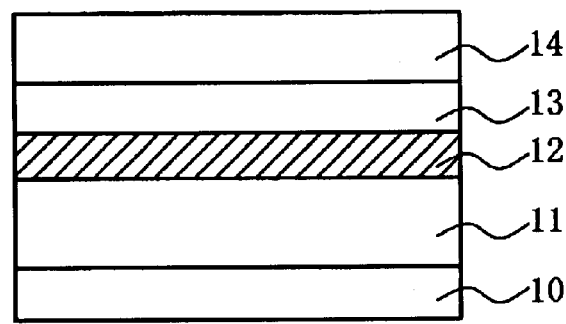
FIGS. 9A through 9C are cross-sectional views illustrating a process of fabricating the MESFET shown in FIG. 8.
Figure 9B:
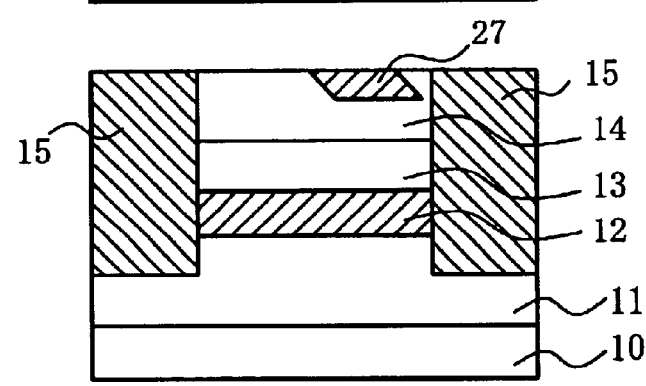
Figure 9C:
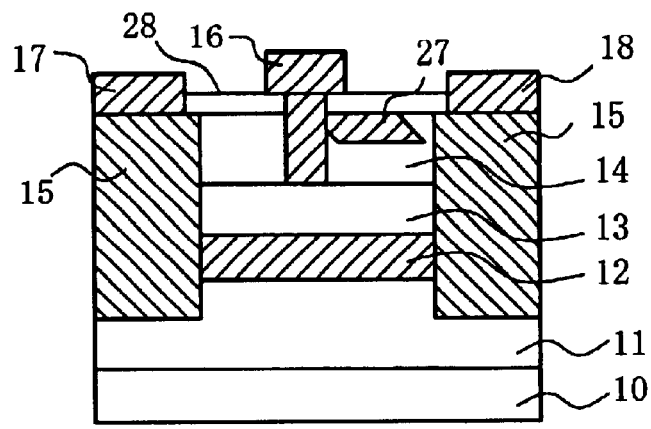

FIGS. 9A through 9C are cross-sectional views illustrating a method of fabricating the third embodiment of the MESFET. As shown in FIG. 9A, an epitaxial substrate (wafer) is formed which includes, on the semi-insulating GaAs substrate 10, the undoped AlGaAs layer 11, the n-GaAs layer 12, the undoped AlGaAs layer 13 and the undoped GaAs layer 14, which layers are epitaxially grown in this order. Next, Si28+ is implanted in the source and drain regions. Then, Mg+ is obliquely implanted at an angle of 30°, a dose of 8E13 cm$^{-2}$ and 25 keV, and is annealed for activation. Thus, the p-type semiconductor layer 27 is formed in the spacer layer 14 as shown in FIG. 9B.

Then, as shown in FIG. 9C, an insulating layer 28 of, for example, SiO$_2$ is deposited on the epitaxial substrate. Thereafter, a hole or opening for forming the gate electrode 16 is formed in the insulating film 28 by patterning and dry etching. Then, tungsten silicide (WSi) is provided by sputtering, and a layer of Ti/Au is deposited. Further, plating of Au is provided and ion milling is then performed so that a portion that is to be the gate electrode 16 is left. Then, a layer of AuGe/Ni/Au is deposited in positions of the source electrode 17 and the drain electrode 18, and is then alloyed. This results in the source electrode 17 and the drain electrode 18 on the ohmic contact layers 15.

(Fourth Embodiment)

Figure 10:
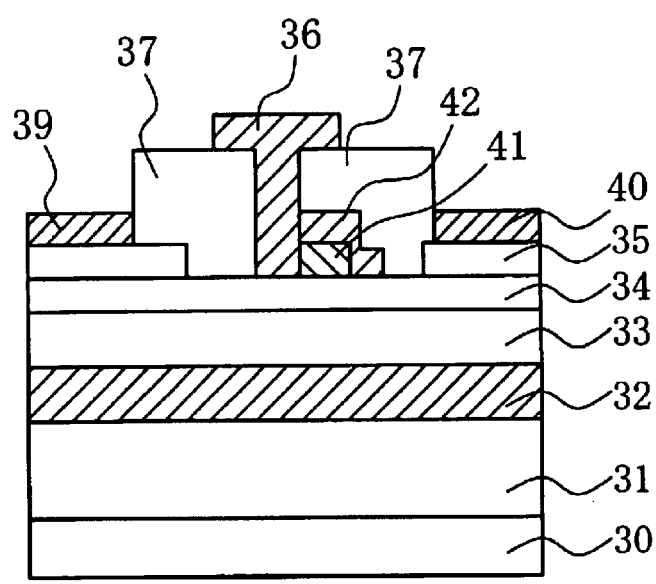
FIG. 10 is a cross-sectional view of a HEMT according to a fourth embodiment of the present invention.

FIG. 10 is a cross-sectional view of a HEMT according to a fourth embodiment of the present invention. The HEMT includes a semi-insulating GaAs substrate 30, an undoped AlGaAs layer 31, an undoped GaAs layer 32, an n-type AlGaAs layer 33, an undoped AlGaAs layer 34, an n-type GaAs layer 35, a gate electrode 36, a source electrode 39, a drain electrode 40 and an insulating layer 37. Further, the HEMT includes a first p-type semiconductor layer 41, and a second p-type semiconductor layer 42, these layers being newly provided according to the present invention. The undoped AlGaAs layer 31 serves as a buffer layer, and the undoped GaAs layer 32 serves as a channel layer. The n-type AlGaAs layer 33 serves as a carrier supply layer, and the undoped AlGaAs layer 34 serves as a spacer layer. The n-type GaAs layer 35 serves as an ohmic contact layer.

The first p-type semiconductor layer 41 corresponds to the aforementioned p-type semiconductor layers or regions 20 and 25, and acts similarly. The second-type semiconductor layer 42 corresponds to the aforementioned p-type semiconductor layers or regions 21 and 26, and acts similarly.

Figure 11A:
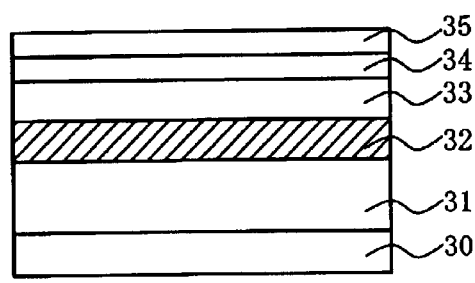
FIGS. 11A through 11E are cross-sectional views illustrating a process of fabricating the HEMT shown in FIG. 10.
Figure 11D:
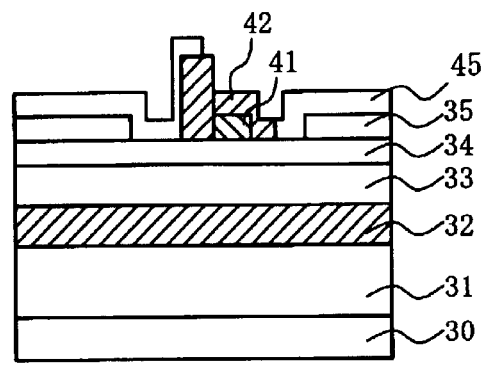
Figure 11B:
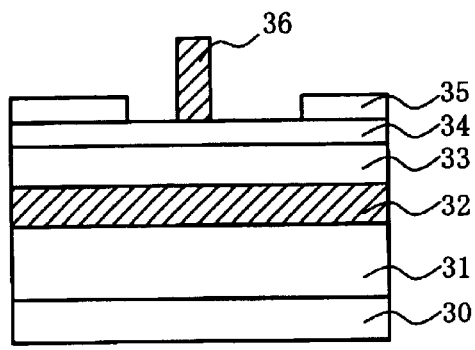
Figure 11E:
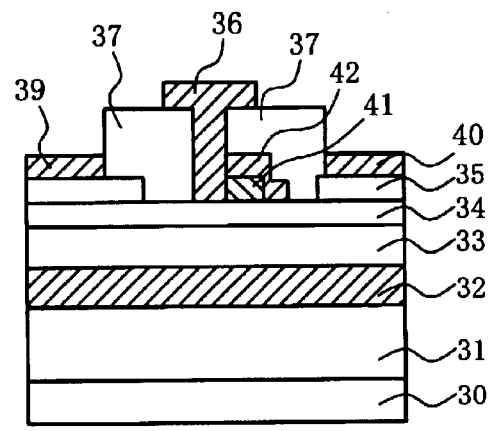

A method of fabricating the HEMT mentioned above is described with reference to FIGS. 11A through 11E. Referring to FIG. 11A, an epitaxial substrate (wafer) is formed which includes, on the semi-insulating GaAs substrate 30, the undoped AlGaAs layer 31, the undoped GaAs layer 32, the n-type AlGaAs layer 33, the undoped AlGaAs layer 34 and the n-type GaAs layer 35, which layers are epitaxially grown in this order. Next, as shown in FIG. 11B, the n-GaAs layer 35 is etched by a citric acid solution so that a gate recess region can be formed. Then, tungsten silicide (WSi) is deposited by sputtering, and is patterned and dry-etched so that the gate electrode 36 of refractory WSi can be formed. More strictly, the gate electrode 36 thus formed is part of the final gate electrode 36.

Figure 11C:
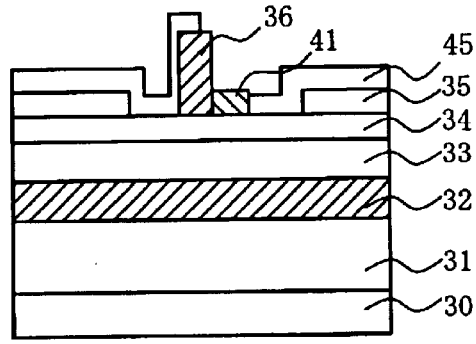

Then, as shown in FIG. 11C, an insulating film 45 of SiO$_2$ is deposited, and a window used to form the first p-type semiconductor layer 41 is formed in the insulating film 45 by etching. Prior to formation of the first p-type semiconductor layer 41, which may be made of carbon-doped p-type GaAs, the surface of the AlGaAs layer 34 exposed through the window is etched by 2 nm by HCl. This intends to remove a surface oxide film or the like on the AlGaAs spacer layer 34. Then, carbon-doped p-type GaAs is selectively grown to a thickness of 20 nm, by MOCVD (Metalganic Chemical Vapor Deposition) at an acceptor concentration of 5E18 cm$^{-3}$ Thereafter, as shown in FIG. 1D, a window used to form the second p-type semiconductor layer 42 is formed in the SiO$_2$ insulating film 45. At this time, the first p-type semiconductor layer 41 is concurrently etched. Then, carbon-doped p-type GaAs is selectively grown to a thickness of 10 nm by MOCVD at an acceptor concentration of 5E17 cm$^{-3}$.

The insulating film 45 is removed and element isolation is made. Then, an insulating layer 37 of SiO$_2$ is deposited. After that, an opening for the gate electrode is formed in the insulating film 37. Subsequently, Ti/Au is deposited and is plated with Au. Subsequent ion milling performed results in the final gate electrode 36. The insulating layer 37 on the ohmic contact layer is removed by etching. Then, AuGe/Ni/Au are deposited in turn and are then alloyed, so that the source electrode 39 and the drain electrode 40 can be formed.

The HEMT thus fabricated has an improved off-state breakdown voltage and greatly reduced leakage current.

The present invention is not limited to the specifically disclosed embodiments, and other embodiments, variations and modifications may be made without departing from the scope of the present invention.

The present invention is based on Japanese patent application no. 2002-093379 filed on Mar. 28, 2002, the entire disclosure of which is hereby incorporated by reference.

What is claimed is:

1. A compound semiconductor device comprising:
   a gate electrode, a drain electrode, and a source electrode; and
   a p-type semiconductor layer provided between the gate electrode and the drain electrode,
   the p-type semiconductor layer having a lower acceptor concentration on a drain aide thereof than that on a gate aide thereof.

2. The compound semiconductor device according to claim 1, wherein:
   the p-type semiconductor layer comprises a first layer close to the gate electrode and a second layer close to the drain electrode; and
   the second layer has an acceptor concentration lower than that of the first layer.

3. The compound semiconductor device according to claim 1, wherein the p-type semiconductor layer comprises a plurality of layers having acceptor concentrations that decrease in order toward the drain electrode.

4. The compound semiconductor device according to claim 1, wherein the p-type semiconductor layer having an acceptor concentration that decreases stepwisely toward the drain electrode.

5. The compound semiconductor device according to claim 1, wherein the p-type semiconductor layer has an oblique ion implantation region formed by obliquely implanting ions from the gate electrode toward the drain electrode.

6. The compound semiconductor device according to claim 1, wherein:
   the p-type semiconductor layer has a first layer close to the gate electrode, and a second layer close to the drain electrode;
   the second layer has an acceptor concentration lower than that of the first layer; and the second layer includes a portion that overlaps with the first layer.

7. The compound semiconductor device according to claim 1, wherein the p-type semiconductor layer is embedded in a layer that does not contain any impurity substantially.

8. The compound semiconductor device according to claim 1, wherein the p-type semiconductor layer is formed on a layer that does not contain any impurity substantially.

9. The compound semiconductor device according to claim 1, wherein the p-type semiconductor layer contacts the gate electrode.

10. The compound semiconductor device according to claim 1, wherein the p-type semiconductor layer is separated from the gate electrode.

11. The compound semiconductor device according to claim 1, wherein the p-type semiconductor layer is covered with an insulating layer.

12. The compound semiconductor device according to claim 1, wherein the compound semiconductor device is a NESFET.

13. The compound semiconductor device according to claim 1, wherein the compound semiconductor device.

* * * * *